(12) United States Patent
Park

(10) Patent No.: US 8,254,203 B2
(45) Date of Patent: Aug. 28, 2012

(54) ADDRESSING CIRCUIT OF SEMICONDUCTOR MEMORY DEVICE AND ADDRESSING METHOD THEREFOR

(75) Inventor: Jin Su Park, Daegu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 273 days.

(21) Appl. No.: 12/790,092

(22) Filed: May 28, 2010

(65) Prior Publication Data

US 2010/0302828 A1    Dec. 2, 2010

(30) Foreign Application Priority Data

May 29, 2009   (KR) .................. 10-2009-0047836

(51) Int. Cl.
*G11C 7/00* (2006.01)
(52) U.S. Cl. ................ 365/238.5; 365/49.1; 365/230.06
(58) Field of Classification Search ............... 365/238.5, 365/49.1, 230.06
See application file for complete search history.

(56) References Cited

U.S. PATENT DOCUMENTS 6,965,540 B2 * 11/2005 Farrell et al. ............... 365/238.5

FOREIGN PATENT DOCUMENTS

KR          200272823       11/2002

OTHER PUBLICATIONS

Notice of Preliminary Rejection from Korean Intellectual Property Office on Nov. 30, 2010.

* cited by examiner

*Primary Examiner* — Jason Lappas
(74) *Attorney, Agent, or Firm* — IP & T Group LLP

(57) ABSTRACT

The addressing circuit of a semiconductor memory device includes a plurality of register units coupled to an input unit and a plurality of memory cell arrays, wherein the plurality of register units are configured to store inputted data in response to register control signals, and a control unit configured to generate the register control signals, using defect information of respective memory cell arrays, to control whether or not the register units store the inputted.

13 Claims, 6 Drawing Sheets

FIG. 6

|  | Main Col | | | | | | | Redundancy Col. | | | | |
|---|---|---|---|---|---|---|---|---|---|---|---|---|
| CAM Latch | 1 | 0 | 1 | 1 | 1 | 0 | 1 | 1 | 0 | 0 | 1 | 1 |

1 : normal
0 : defective

| time | | | | | | | | | | | | |
|---|---|---|---|---|---|---|---|---|---|---|---|---|
| t=1 | 0 | | | | | | | | | | | |
| t=2 | 1 | | 0 | | | | | | | | | |
| t=3 | 2 | | 1 | 0 | | | | | | | | |
| t=4 | 3 | | 2 | 1 | 0 | | | | | | | |
| t=5 | 4 | | 3 | 2 | 1 | | 0 | | | | | |
| t=6 | 5 | | 4 | 3 | 2 | | 1 | 0 | | | | |
| t=7 | 6 | | 5 | 4 | 3 | | 2 | 1 | | 0 | | |
| t=8 | 7 | | 6 | 5 | 4 | | 3 | 2 | | | 1 | 0 |

(t=time)

FIG. 7

|  | Main Col | | | | | | | Redundancy Col. | | | |
|---|---|---|---|---|---|---|---|---|---|---|---|
| CAM Latch | 1 | 0 | 1 | 1 | 1 | 0 | 1 | 1 | 0 | 0 | 1 | 1 |

1 : normal
0 : defective

| t=1 | 7 |  | 6 | 5 | 4 |  | 3 | 2 |  |  | 1 | 0 |
| t=2 |  |  | 7 | 6 | 5 |  | 4 | 3 |  |  | 2 | 1 |
| t=3 |  |  |  | 7 | 6 |  | 5 | 4 |  |  | 3 | 2 |
| t=4 |  |  |  |  | 7 |  | 6 | 5 |  |  | 4 | 3 |
| t=5 |  |  |  |  |  |  | 7 | 6 |  |  | 5 | 4 |
| t=6 |  |  |  |  |  |  |   | 7 |  |  | 6 | 5 |
| t=7 |  |  |  |  |  |  |   |   |  |  | 7 | 6 |
| t=8 |  |  |  |  |  |  |   |   |  |  |   | 7 |

(t=time)

ADDRESSING CIRCUIT OF SEMICONDUCTOR MEMORY DEVICE AND ADDRESSING METHOD THEREFOR

Priority to Korean patent application number 10-2009-0047836 filed on May 29, 2009, the entire disclosure of which is incorporated by reference herein, is claimed.

BACKGROUND

Exemplary embodiments relate to an addressing circuit of a semiconductor memory device and a method for addressing and, more particularly, to an addressing circuit for assigning data to normal cell arrays including main cell arrays and redundant cell arrays.

In general, defective cell arrays, including, for example defective columns, are detected by testing semiconductor memory devices.

Generally, the defective cell array is repaired by first comparing an address of external input data and an address of a defective cell array. Then, if as a result of the comparison, the address of external input data is identical with the address of the defective cell array, the external input data is assigned to a redundant cell array.

In such a redundancy operation, because addresses are compared, more time for performing the redundancy operation may be required.

BRIEF SUMMARY

Exemplary embodiments relate to an addressing circuit of a semiconductor memory device and an addressing method therefore to perform a data addressing operation or a redundancy operation without comparing addresses, in a manner such that sequentially inputted data are sequentially sent to register units, which are sequentially arranged, wherein the input data is not stored in a register unit corresponding to a defective cell array, but passed through the register unit.

The addressing circuit of a semiconductor memory device according to an aspect of the present disclosure includes a plurality of register units coupled to an input unit and a plurality of memory cell arrays, wherein the plurality of register units are configured to store inputted external data in response to register control signals, and a control unit configured to generate control signals, using defect information of respective memory cell arrays, to control whether or not the register units store the inputted external data.

Each of the plurality of register units may be either a first register unit or a second register unit, wherein the first register unit stores data and shifts data stored in the first register unit to another register unit, and the second register unit passes data to another register unit without storing the data. Further, the first register unit is coupled to a normal memory cell array and the second register unit is coupled to a defective memory cell array.

The control unit may include a plurality of content addressable memory (CAM) latches which store the defect information and output the defect information as CAM data, and a plurality of control clock generators which generate the control signals including a control clock signal and an inverse control clock signal in response to the CAM data, a clock signal, and a clock control signal.

An addressing method of a semiconductor memory device according to another aspect of the present disclosure includes receiving external data, determining whether a memory cell array is a normal memory cell array or a defective memory cell array depending on defect information, and assigning the external data inputted sequentially to the normal memory cell arrays. Here, the normal memory cell arrays comprise main cell arrays and redundant cell arrays.

BRIEF DESCRIPTION OF THE DRAWINGS

FIG. 6 is a diagram illustrating a data input operation and addressing method according to an embodiment of this disclosure.

FIG. 7 is a diagram illustrating a data output operation according to an embodiment of this disclosure.

DESCRIPTION OF EMBODIMENTS

Hereinafter, some exemplary embodiments of the present disclosure will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. The figures are provided to allow those having ordinary skill in the art to understand the scope of the embodiments of the disclosure.

Figure 1:
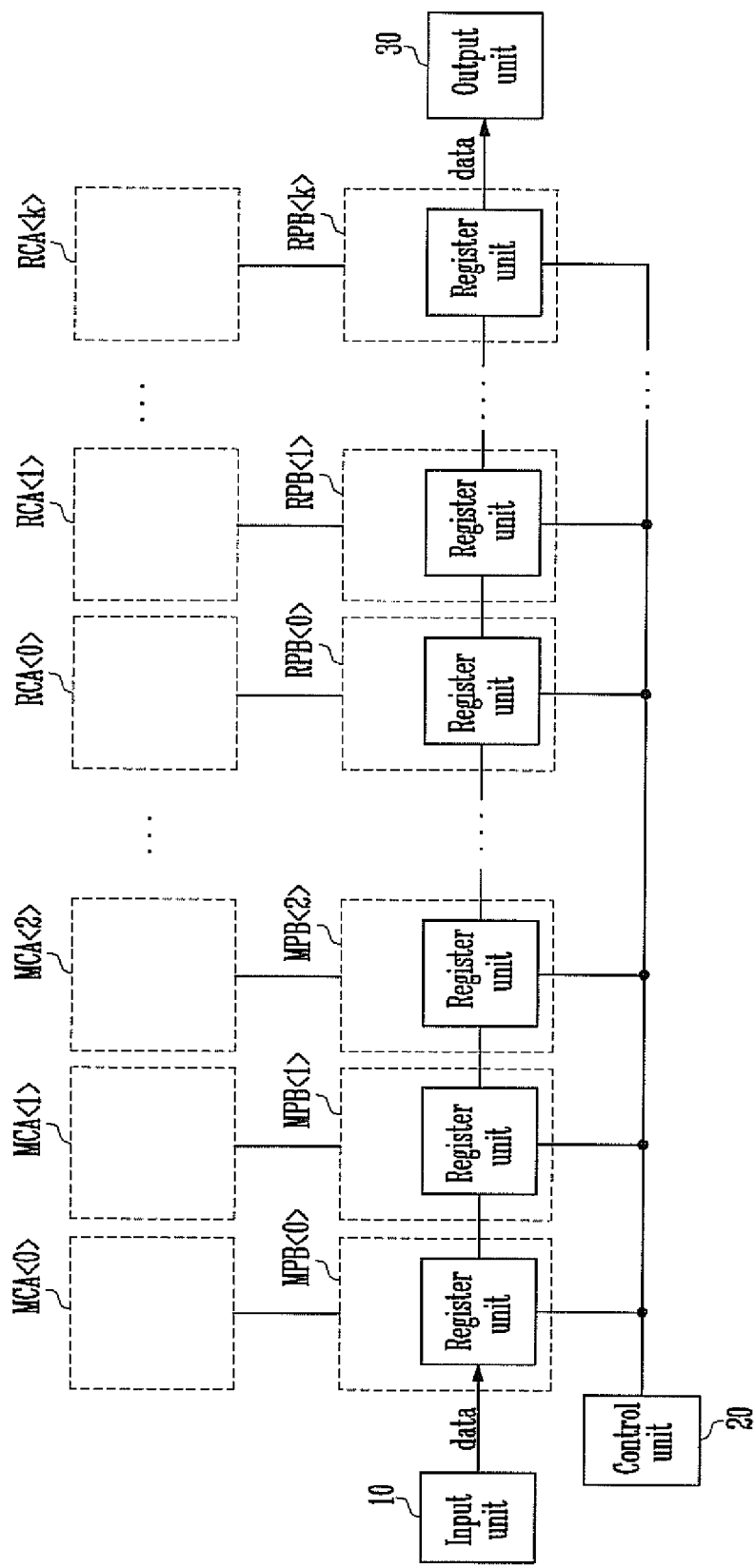
FIG. 1 is a diagram showing a semiconductor memory device including an addressing circuit according to an embodiment of this disclosure.

FIG. 1 is a diagram showing the semiconductor memory device including an addressing circuit according to an embodiment of this disclosure.

Referring to FIG. 1, the semiconductor memory device includes input unit 10, main cell arrays MCA<0>, MCA<1>, MCA<2> . . . , redundant cell arrays RCA<0>, RCA<1> . . . , RCA<k>, main cell page buffers MPB<0>, MPB<1>, MPB<2> . . . , redundant cell page buffers RPB<0>, RPB<1> . . . , RPB<k>, control unit 20 and output unit 30.

The main cell page buffers are coupled to corresponding main cell arrays, and the redundant cell page buffers are coupled to corresponding redundant cell arrays.

FIG. 1 shows each of the main cell page buffers and the redundant cell page buffers including a register unit. However, the register units may be included in the main cell page buffers and the redundant cell page buffers, or may be separate from them.

Figure 2:
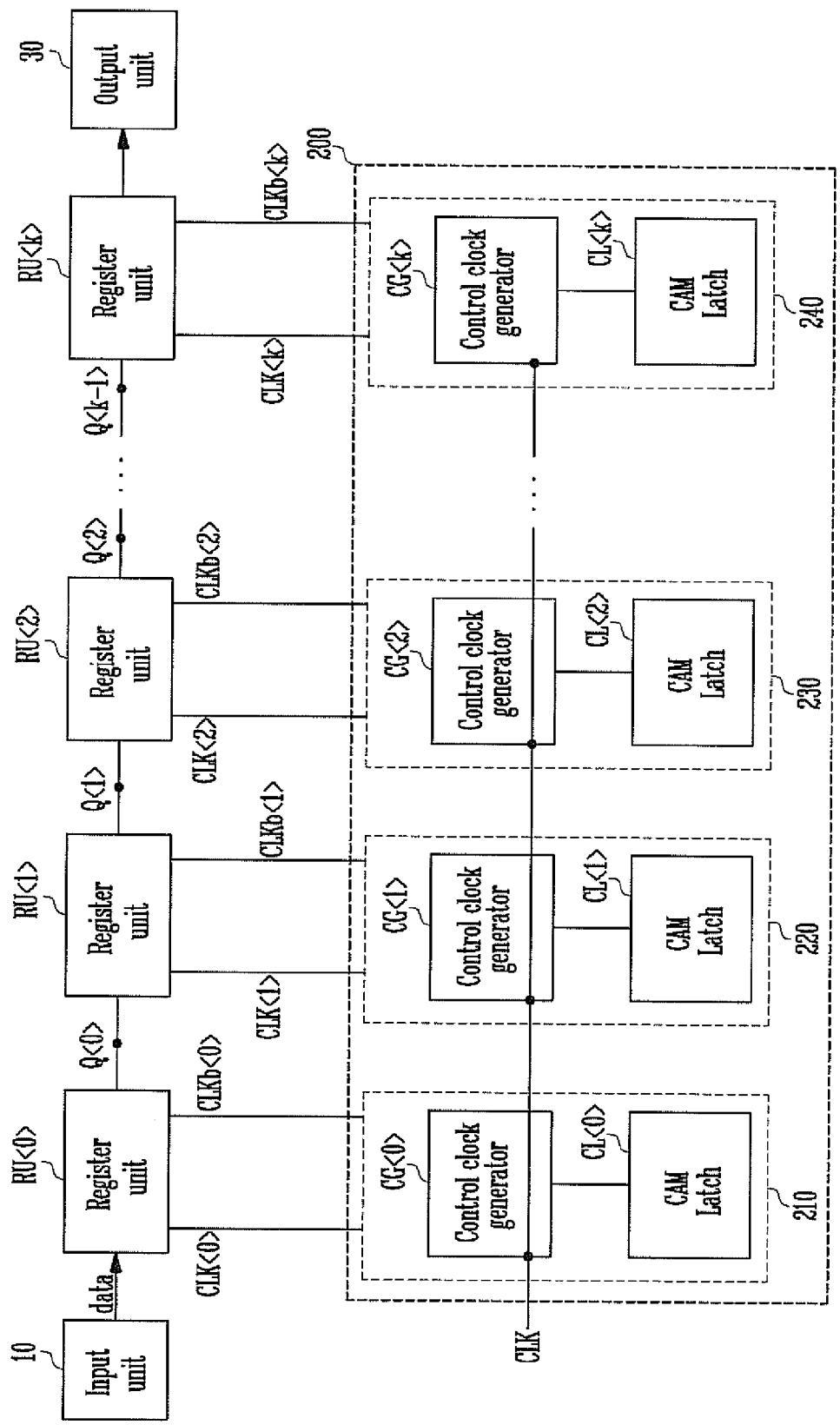
FIG. 2 is diagram showing an exemplary configuration of an addressing circuit of the semiconductor memory device according to an embodiment of this disclosure.

FIG. 2 is diagram showing an exemplary configuration of an addressing circuit of the semiconductor memory device according to an embodiment of this disclosure.

Referring to FIG. 2, the addressing circuit includes a plurality of register units RU<0>, RU<1>, RU<2> . . . RU<k>, and a control unit 200.

The control unit 200 may include a plurality of register control units 210, 220, 230 . . . 240, and each of the register control units 210, 220, 230 . . . 240 may include a control clock generator CG<0>, CG<1>, CG<2> . . . CG<k> and a content addressable memory (CAM) latch CL<0>, CL<1>, CL<2> . . . CL<k>.

The control unit 200 outputs control clock signals CLK<0:k> and inverse control clock signals CLKb<0:k> to the respective register units RU<0:k> in response to a clock signal CLK. The control unit 200 includes register control units 210 to 240 corresponding to the register units RU<0:k>. The register control units 210 to 240 output corresponding pairs of control clock signals CLK<0:k> and inverse control clock signals CLKb<0:k> depending on defect information. The defect information including the addresses of defective cell arrays may be stored in content addressable memory (CAM) latches CL<0>, CL<1>, CL<2> . . . CL<k> of each of the register control units 210 to 240.

When external input data is inputted through an input unit, the external input data are serially inputted to the initial register unit RU<0>. The register units RU<0:k> are coupled in series, and each of the register units RU<0:k> is either a first register unit or a second register unit. Herein, a first register unit is coupled to a normal memory cell array and a second register unit is coupled to a defective memory cell array. A first register unit stores data received from the input unit or from another register unit, and shifts data stored in the first register unit to another register unit. A second register unit passes data to another register unit without storing the data. In other words, data being inputted is assigned only to the first register units in the order the data are inputted regardless of their address.

Whether a register unit RU<0:k> is a first register unit or a second register unit is determined in accordance with defect information. Further, the address of the second register units (i.e., the address of the defective memory cell arrays) may be stored in the CAM cell array, and the CAM latch corresponding to the register unit may store the information read from the CAM cell array. Therefore, whether a register unit is a first register unit or a second register unit may be determined depending on the information of the corresponding CAM latch of the control unit.

For example, when first data is inputted to the register unit RU<0>, the first data is stored in the register unit RU<0>. Also, when the second data is inputted to the register unit RU<0>, the first data is shifted to the register unit RU<1> and stored in the register unit RU<1> if it is a first register unit, and the second data is stored in the register unit RU<0>. However, if the register unit RU<1> is a second register unit, the first data passes through the register unit RU<1> to the register unit RU<2> without being stored in the register unit RU<1>. In this case, the first data is stored in the register unit RU<2>, if the register unit RU<2> is a first register unit.

Figure 3:
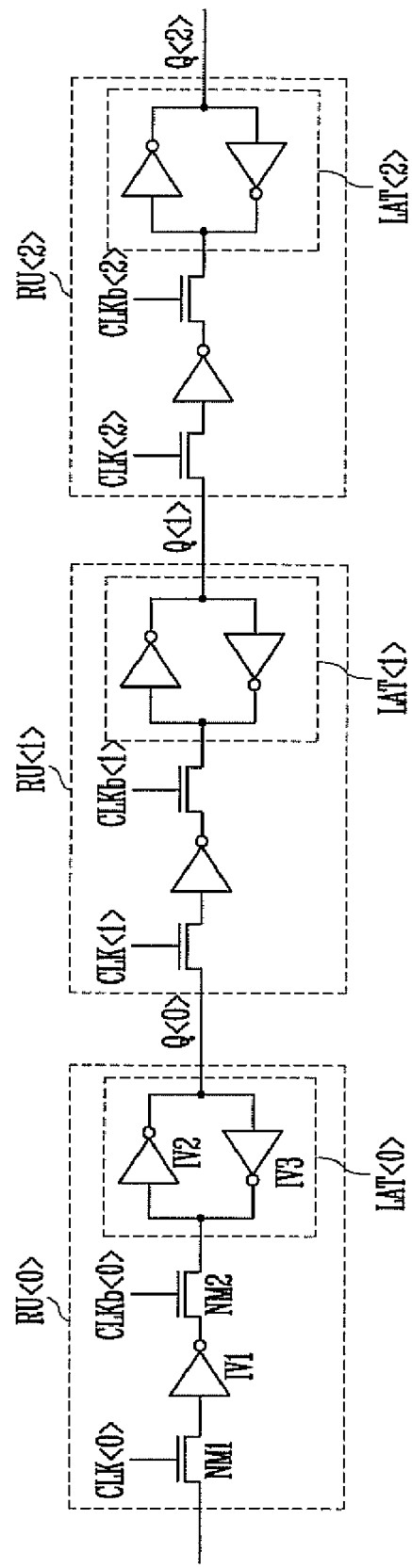
FIG. 3 is a circuit diagram of the register units shown in FIG. 2.

FIG. 3 is a circuit diagram of the register units shown in FIG. 2.

Each of the registers of register units RU<0:k> may have the same construction, and so only the register unit RU<0> is described as an example for sake of convenience.

The register unit RU<0> includes NMOS transistors NM1, NM2, an inverter IV1, and a latch LAT<0>. The NMOS transistor NM1, the inverter IV1, and the NMOS transistor NM2 are coupled in series between an input terminal and the input node of the latch LAT<0>. The NMOS transistor NM1 passes data received from the input terminal to the inverter IV1 in response to the control clock signal CLK<0>. The NMOS transistor NM2 passes data received from an output of the inverter IV1 to the latch LAT<0> in response to the inverse control clock signal CLKb<0>. The data stored in the latch LAT<0> is outputted to the register unit RU<1>.

Figure 4:
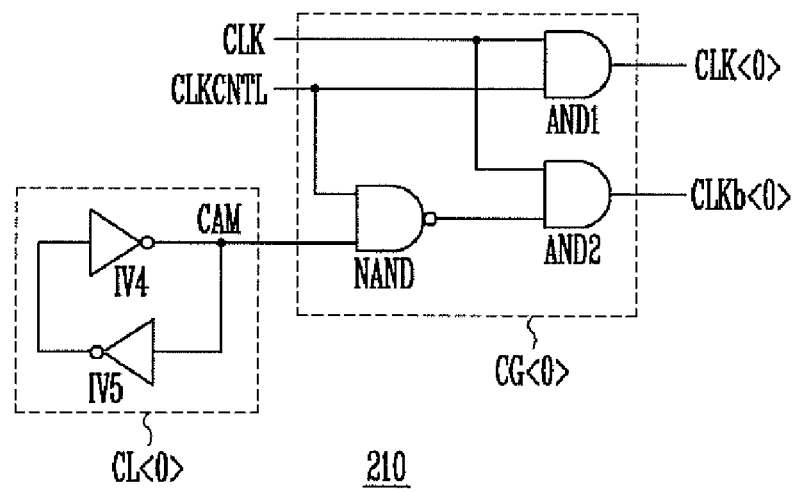
FIG. 4 is a circuit diagram of one of the control units shown in FIG. 1.

FIG. 4 is a circuit diagram of one of the register control units shown in FIG. 2.

The register control units 210 to 240 may have the same construction, and so only the register control unit 210 is described as an example for sake of convenience.

The register control unit 210 includes a CAM latch CL<0> and a control clock generator CG<0>.

The CAM latch CL<0> may store information related to a defective cell array. For example, the output node of the CAM latch CL<0> may output CAM data CAM as a low level if the corresponding column, which includes a cell string and a bit line, failed a wafer test and the CAM data CAM of a high level if the column passed the wafer test.

The control clock generator CG<0> may include a NAND gate NAND and first and second AND gates AND1 and AND2.

The NAND gate NAND inputs the CAM data CAM and a clock control signal CLKCNTL, performs a NAND operation on the inputted signals, and outputs a logic combination signal as a result of the NAND operation. The first AND gate AND1 inputs the clock signal CLK and the clock control signal CLKCNTL, performs an AND operation on the inputted signals, and outputs the control clock signal CLK<0>. The second AND gate AND2 inputs the clock signal CLK and the output signal of the NAND gate NAND, performs an AND operation on the inputted signals, and outputs the inverse control clock signal CLKb<0>.

Figure 5:
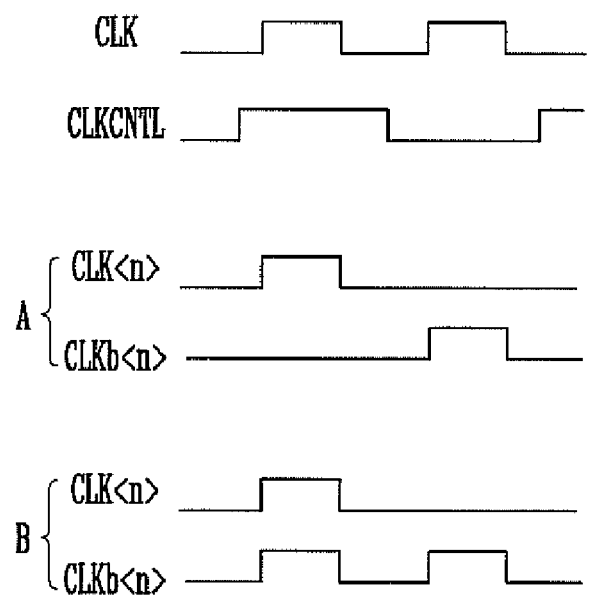
FIG. 5 is a waveform diagram illustrating signals generated by the control unit shown in FIG. 4.

FIG. 5 is a waveform illustrating signals generated by the control unit 210 shown in FIG. 4.

Reference label "A" of FIG. 5 represents a waveform of signals when a register unit corresponds to a normal cell array, and reference label "B" of FIG. 5 represents a waveform of signals when a register unit corresponds to a defective cell array.

FIG. 6 is a diagram illustrating a data input operation and addressing method according to an embodiment of this disclosure.

The data input operation and addressing method according to an embodiment of this disclosure is described below with reference to FIGS. 1 to 6.

In the present embodiment, it is assumed that, as shown in FIG. 6, the second and sixth register units RU<1> and RU<5> correspond to defective cell arrays.

First, inputted external data 0 to 7 are sequentially received through the input unit 10, wherein the 0 to 7 may be the external address.

The first inputted external data 0 are stored in the register unit RU<0>. More particularly, the control clock signal CLK<0> is first toggled in response to the clock signal CLK, the clock control signal CLKCNTL, and the CAM data CAM of a high level state outputted from the CAM latch CL<0> of the register control unit 210. As a result of the toggling of the control clock signal CLK<0>, the NMOS transistor NM1 of the register unit RU<0> is turned on, and thus, the first inputted external data 0 are received by the register unit RU<0>. Next, when the inverse control clock signal CLKb<0> is toggled, the NMOS transistor NM2 is turned on, and so the first inputted external data 0 are stored in the latch LAT<0>. Next, the second inputted external data 1 are received through the input unit 10. The second inputted external data 1 are stored in the register unit RU<0>. Here, the second inputted external data 1 are stored in the register unit RU<0> in the same manner as the first inputted external data 0, and so a description thereof is omitted.

During the time for which the second inputted external data 1 are stored in the register unit RU<0>, the register unit RU<1> receives the first inputted external data 0 from the register unit RU<0> and passes the first inputted external data 0 to the register unit RU<2>. More particularly, the control clock signal CLK<1> and the inverse control clock signal CLKb<1> are toggled at the same time in response to the clock signal CLK, the clock control signal CLKCNTL, and the CAM data CAM of a low level output by the CAM latch CL<1> of the register control unit 220. Here, the control clock signal CLK<2> inputted to the register unit RU<2> is also toggled. Thus, the first inputted external data 0 are received by the register unit RU<2>. Next, when the inverse control clock signal CLKb<2> is toggled, the NMOS transistor NM2 is turned on. Accordingly, the first inputted external data 0 are stored in the latch LAT<2> of the register unit RU<2>.

As described above, in the case in which a register unit corresponds to a defective cell array, corresponding inputted external data are immediately passed to a next register unit in the series of the register units RU<0:k>. In other words, if a register unit corresponds to a defective cell array during a data input operation, an operation of storing corresponding data is skipped, and the corresponding data are passed to a next register unit.

In accordance with the above method, the sequential inputted external data 0 to 7 may be sequentially moved to and stored in the remaining register units, except in register units corresponding to a defective cell array.

In accordance with the exemplary embodiments of this disclosure, an addressing method of a semiconductor memory device includes receiving external data, determining whether a memory cell array is a normal memory cell array or a defective memory cell array depending on defect information, and assigning the external data inputted sequentially to the normal memory cell arrays (those memory cell arrays except for the defective memory cell arrays) consecutively. Accordingly, data can be rapidly inputted without the need to compare addresses as is done in a typical redundancy operation.

FIG. 7 is a diagram illustrating a data output operation according to an embodiment of this disclosure.

The data output operation according to an embodiment of this disclosure is described below with reference to FIGS. 1 to 5 and 7.

In the present embodiment, it is assumed that, as shown in FIG. 7, the second and sixth register units RU<1> and RU<S> correspond to defective cell arrays.

The output data 0 to 7 stores using the above data input method are sequentially output. For example, the output data 0 stored in the register unit RU<K> which is the closest to the output unit 30 is output to the data the output unit 30.

Furthermore, the output data 1 stored in register unit RU<K–1> is sent to the register unit RU<K>. More particularly, the control clock signal CLK<K> is first toggled in response to the clock signal CLK, the clock control signal CLKCNTL, and the CAM data CAM of a high level output by the CAM latch CL<k> of the register control unit 240. As a result of the toggling of the control clock signal CLK<k>, the NMOS transistor NM1 of the register unit RU<k> is turned on, and thus, the output data 1 stored in register unit RU<K–1> are received by the register unit RU<k>. Next, when the inverse control clock signal CLKb<k> is toggled, the NMOS transistor NM2 is turned on, and so the output data 1 are stored in the latch LAT<k>.

In a similar way, a register unit corresponding to a normal cell arrays receives output data from a previous register unit, and the output data stored in the register unit is sent to a next register unit.

The operation of a register unit corresponding to a defective cell array is described below. The register unit RU<1> receives the output data 7 from the register unit RU<0> and sends the output data 7 to the register unit RU<3>. More particularly, the control clock signal CLK<1> and the inverse control clock signal CLKb<1> are toggled at the same time in response to the clock signal CLK, the clock control signal CLKCNTL, and the CAM data CAM of a low level output by the CAM latch CL<1> of the register control unit 220. Here, the control clock signal CLK<2> inputted to register unit RU<2> is also toggled. Thus, the output data 7 inputted to the register unit RU<I> is sent to the inverter IV1 of the register unit RU<2>. Next, when the inverse control clock signal CLKb<2> is once toggled, the NMOS transistor NM2 is turned on. Consequently, the output data 7 is stored in the latch LAT<2> of the register unit RU<2>.

As described above, in the case in which a register unit corresponds to a defective cell array, corresponding output data is immediately sent to a next register unit. In other words, if a register unit corresponds to a defective cell array during a data output operation, an operation of outputting corresponding data is skipped, and the corresponding data is outputted to a next register unit.

What is claimed is:

1. An addressing circuit of a semiconductor memory device, the addressing circuit comprising:
    a plurality of register units coupled to an input unit and a plurality of memory cell arrays, wherein the plurality of register units are configured to store inputted external data in response to register control signals; and
    a control unit configured to generate the register control signals, using defect information of respective memory cell arrays, to control whether or not the register units store the inputted external data.

2. The addressing circuit of claim 1, wherein the defect information of the respective memory cell arrays is stored in a content addressable memory (CAM) cell array coupled to the control unit.

3. The addressing circuit of claim 1, wherein the register unit is included in a page buffer.

4. The addressing circuit of claim 1, wherein the register unit is coupled to a page buffer.

5. The addressing circuit of claim 1, wherein each of the plurality of register units is either a first register unit or a second register unit, wherein the first register unit is coupled to a normal memory cell array and the second register unit is coupled to a defective memory cell array.

6. The addressing circuit of claim 5, wherein the first register unit is configured to store data received from the input unit or another register, and to shift data stored in the first register unit to another register unit, and the second register unit is configured to pass data to another register unit without storing the data.

7. The addressing circuit of claim 1, wherein each of the plurality of register units comprises:
    a first switch configured to control an input of the inputted external data from another register unit or the input unit;
    a second switch configured to control an output of the inputted external data to another register unit; and
    a latch configured to temporarily store the inputted external data.

8. The addressing circuit of claim 7, wherein the control unit comprises:
    a plurality of content addressable memory (CAM) latches configured to store the defect information and output the defect information as CAM data; and
    a plurality of control clock generators configured to generate the register control signals, including a control clock signal and an inverse control clock signal, in response to the CAM data, a clock signal, and a clock control signal.

9. The addressing circuit of claim 8, wherein:
the first switch receives the inputted external data in response to the control clock signal, and
the second switch stores the inputted external data in the latch in response to the inversed control clock signal.

10. The addressing circuit of claim 9, wherein when one of the register units corresponds to a defective cell array, the control unit toggles the corresponding control clock signal and the corresponding inverse control clock signal simultaneously.

11. The addressing circuit of claim 10, wherein when one of the register units corresponds to a normal cell array, the control unit toggles the corresponding control clock signal and the corresponding inverse control clock signal sequentially.

12. An addressing method of a semiconductor memory device which comprises a plurality of memory cell arrays, the addressing method comprising:
receiving external data;
determining whether a memory cell array of the plurality of memory cell arrays is a normal memory cell array or a defective memory cell array depending on defect information; and
assigning the external data inputted sequentially to normal memory cell arrays.

13. The addressing method of claim 12, wherein the normal memory cell arrays comprise main cell arrays and redundant cell arrays.

* * * * *